United States Patent
Shimizu et al.

(10) Patent No.: US 7,466,605 B2
(45) Date of Patent: Dec. 16, 2008

(54) SEMICONDUCTOR DEVICE AND CONTROL METHOD THEREFOR

(75) Inventors: Atsushi Shimizu, Kawasaki (JP); Hiroki Murakami, Kawasaki (JP)

(73) Assignee: Spansion LLC, Sunnyvale, CA (US)

(*) Notice: Subject to any disclaimer, the term of this patent is extended or adjusted under 35 U.S.C. 154(b) by 282 days.

(21) Appl. No.: 11/360,091

(22) Filed: Feb. 22, 2006

(65) Prior Publication Data
US 2006/0239108 A1   Oct. 26, 2006

Related U.S. Application Data

(63) Continuation of application No. PCT/JP2005/002891, filed on Feb. 23, 2005.

(51) Int. Cl.
*G11C 7/00* (2006.01)

(52) U.S. Cl. ............ 365/189.11; 365/230.06; 365/185.23

(58) Field of Classification Search ............ 365/189.11, 365/230.06, 185.23, 227, 185.13, 185.33, 365/154
See application file for complete search history.

(56) References Cited

U.S. PATENT DOCUMENTS

| | | | |
|---|---|---|---|
| 5,412,331 A * | 5/1995 | Jun et al. ............ | 326/105 |
| 5,532,971 A | 7/1996 | Tanaka et al. | |
| 5,802,008 A * | 9/1998 | Park et al. ............ | 365/230.06 |
| 6,026,047 A * | 2/2000 | Ryu et al. ............ | 365/230.06 |
| 6,587,375 B2 * | 7/2003 | Chung et al. ............ | 365/185.13 |
| 6,646,950 B2 | 11/2003 | Akaogi | |
| 2002/0036923 A1 | 3/2002 | Chung et al. | |
| 2002/0159296 A1 | 10/2002 | Akaogi | |
| 2002/0176312 A1 | 11/2002 | Lee et al. | |
| 2003/0090311 A1 | 5/2003 | Pan et al. | |

FOREIGN PATENT DOCUMENTS

| | | |
|---|---|---|
| JP | 07-169282 | 4/1995 |
| JP | 2002-056688 | 2/2002 |
| JP | 2002-352591 | 12/2002 |
| JP | 2003-016793 | 1/2003 |
| JP | 2005-509998 | 4/2005 |
| WO | WO 03/043014 A1 | 5/2003 |

* cited by examiner

*Primary Examiner*—Dang T Nguyen
(74) *Attorney, Agent, or Firm*—Ingrassia Fisher & Lorenz, P.C.

(57) ABSTRACT

A non-volatile semiconductor device provides a pull-up transistor (M1) for a word line drive which can be downsized. The semiconductor device includes a first decoder (109) including a pull-up transistor (M1) selecting and driving a word line (P2WL) connected to memory cells, a first voltage generating circuit (102) generating a first voltage applied to a source terminal of the pull-up transistor (M1), a second voltage generating circuit (105) generating a second voltage that is applied to a gate terminal of the pull-up transistor (M1), is the second voltage higher than the first voltage, sectors including the memory cells, a vertical word line (VWL) connecting the sectors in a vertical direction and carrying the first voltage to the source terminal of the pull-up transistor (M1), a global word line (GWL) connecting the sectors in a lateral direction and carrying the second voltage to the gate terminal of the pull-up transistor (M1), a second decoder (108) selecting and driving the global word line (GWL), and a third decoder (104) selecting and driving the vertical word line (VWL).

12 Claims, 9 Drawing Sheets

SEMICONDUCTOR DEVICE AND CONTROL METHOD THEREFOR

CROSS-REFERENCES TO RELATED APPLICATIONS

This is a continuation of International Application No. PCT/JP2005/002891, filed Feb. 23, 2005 which was not published in English under PCT Article 21(2).

BACKGROUND OF THE INVENTION

1. Field of the Invention

This invention generally relates to a semiconductor device and to a control method for a semiconductor device.

2. Description of the Related Art

In recent years, applications of non-volatile semiconductor memories such as flash memories or the like have remarkably expanded. Flash memories are known which employ a cell array architecture such as NOR type flash memories, NAND type flash memories, AND type flash memories, and the like. One of the characteristic aspects of flash memories is an erase operation which operates on a sector basis. Various proposals have been made for the sector arrangement. For example, it is well known that sectors are located in a matrix, the sectors laterally connected by a global word line and vertically connected by a vertical word line. Each sector includes multiple local word lines selectively connected via the global word line and the vertical word line.

FIG. 1 is a view showing the main circuit components to be used when a high voltage is applied to a local word line decoder (word line driver) in a conventional flash memory as disclosed in U.S. Pat. No. 6,646,950 ("Patent Document 1"). As shown in FIG. 1, a flash memory 1 includes a high voltage generating circuit 2, switch circuits 3 provided for respective banks, a high voltage output circuit (vpxv) 4, high voltage output circuits (gvpx) 5 provided for respective sectors, global word line decoders (xdec) 6, a vertical word line decoder (vxdec) 7, and local word line decoders (xdec_sub) 8. The local word line decoders (xdec_sub) 8 drive the word line by using a bootstrap as disclosed in more detail below. The high voltage generating circuit 2 generates the word line voltage (RVPXG) and the word line driving voltage (GVPXG).

FIG. 2 is a circuit diagram showing the structure of a local word line decoder (xdec_sub) 8 as disclosed in Patent Document 1. As shown in FIG. 2, the local word line decoder (xdec_sub) 8 is composed of n-channel transistors M1, M2, and M3. The transistor M1 is a pull-up transistor, and the transistor M2 is a pull-down transistor.

A vertical word line VWL is selectively connected to a local word line P2WL(n) via the transistor M1. The gate of the transistor M1 is controlled by a global word line GWLN via the transistor M3. The high voltage generating circuit 2 is employed as a single voltage source, and the word line voltage applied to the vertical word line VWL and the word line driving voltage applied to the global word line GWLN have the same potential levels. The local word line P2WL and the vertical word line VWL are configured to have the same potentials by coupling a node BST (Bootstrap) and the vertical word line VWL and pulling up to a higher level.

The following problems arise, however, when the local word line decoder (xdec_sub) 8 is driven by only a single voltage source as described above. Firstly, as the flash memories are further downsized, there is a demand for downsizing the above-mentioned transistors included in the local word line decoder as much as possible. Such demand reduces a capacitance CB between the node BST and the vertical word line VWL, making the Bootstrap hard to adequately operate in that a sufficient gate voltage is not available for the gate voltage of the transistor M1.

Secondly, while the word line is being driven for a long period, the node BST is discharged by the leakage from the transistor M3 that cramps the node BST, thereby reducing the voltage in the node BST. Accordingly, a sufficient voltage is not available for a gate voltage of the transistor M1 resulting in a voltage drop in the word line. Thirdly, as the flash memories are further downsized, the channel length of the transistor is also shortened. The leakage from the transistor M3 becomes greater and poses a problem, even if the word line is driven for a short period. The above-described problems create limitations in downsizing the transistor included in the word line driver.

SUMMARY OF THE INVENTION

The present invention has been made is view of the above circumstances and has an object of providing a semiconductor device and the control method for such semiconductor so that a transistor included in the word line driver can be downsized.

To address the above-mentioned problems, in accordance with an aspect of the present invention, preferably, there is provided a semiconductor device including a first decoder including a pull-up transistor selecting and driving a word line connected to memory cells, a first voltage generating circuit generating a first voltage applied to a source terminal of the pull-up transistor, and a second voltage generating circuit generating a second voltage that is applied to a gate terminal of the pull-up transistor, the second voltage being higher than the first voltage. Thus, in accordance with the present invention, it is possible to apply the second voltage to the gate terminal of the pull-up transistor, the second voltage being higher than the first voltage to be applied to the source terminal of the pull-up transistor. Accordingly, even if a capacitance CB between the nose BST and the VWL becomes smaller due to downsizing and the bootstrap is not working adequately, a sufficient voltage is available for the gate voltage of the pull-up transistor. This allows the transistor included in the word line driver to be downsized.

The above-mentioned semiconductor device may further include sectors including the memory cells, a vertical word line connecting the sectors in a vertical direction and carrying the first voltage to the source terminal of the pull-up transistor, a global word line connecting the sectors in a lateral direction and carrying the second voltage to the gate terminal of the pull-up transistor, a second decoder selecting and driving the global word line, and a third decoder selecting and driving the vertical word line.

In accordance with another aspect of the present invention, preferably, there is provided a method of controlling a semiconductor device including the steps of generating, by a first voltage generating circuit, a first voltage applied to a source terminal of a pull-up transistor selecting and driving a word line connected to memory cells and generating, by a second voltage generating circuit, a second voltage that is applied to a gate terminal of the pull-up transistor and is higher than the first voltage. In accordance with a method of the present invention, it is thus possible to apply the second voltage to the gate terminal of the pull-up transistor, the second voltage being higher than the first voltage to be applied to the source terminal of the pull-up transistor. Accordingly, even if a capacitance CB between the nose BST and the VWL becomes smaller due to downsizing and the bootstrap is not working adequately, a sufficient voltage is available for the gate voltage of the pull-up transistor. This allows the transistor included in the word line driver to be downsized.

Therefore, in accordance with the present invention, it is possible to provide a semiconductor device and a control method therefor, in which a transistor included in the word line driver can be downsized.

BRIEF DESCRIPTION OF THE DRAWINGS

The present invention will hereinafter be described in conjunction with the following drawing figures, wherein like numerals denote like elements.

DESCRIPTION OF THE PREFERRED EMBODIMENTS

Figure 3:
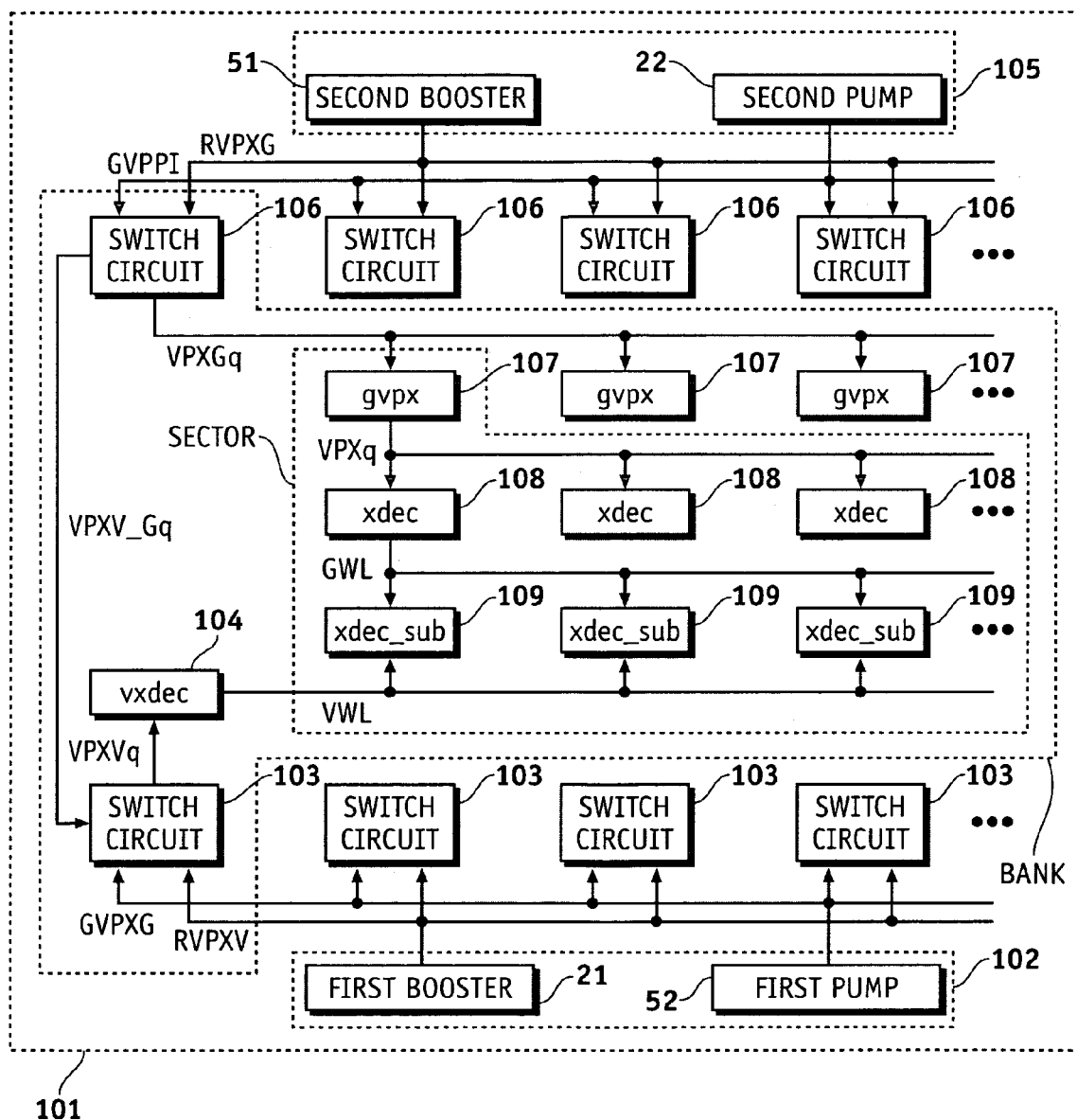
FIG. 3 is a block diagram showing a configuration of a flash memory, which is an example of a non-volatile semiconductor memory in accordance with an embodiment of the present invention.

A description will now be given, with reference to the accompanying drawings, of embodiments of the present invention. FIG. 3 is a block diagram showing a configuration of a flash memory, which is an example of a non-volatile semiconductor memory in accordance with an embodiment of the present invention. Referring to FIG. 3, a flash memory 101 includes a first high voltage generating circuit 102, switch circuits 103, a vertical word line decoder (vxdec: a third decoder) 104, a second high voltage generating circuit 105, switch circuits 106, high voltage output circuits (gvpx) 107, global word line decoders (xdec: a second decoder) 108, and local word line decoders (xdec_sub: a first decoder) 109. A signal RVPXG becomes high during reading, a signal GVPXG becomes high during writing, a signal RVPXV becomes high during reading, a signal GVPXV becomes high during writing, and a signal VPXV_Gq supplies the voltage level to be applied to the selected global word line GWL during reading.

Multiple sectors are provided in a row direction and in a column direction. Each sector includes multiple non-volatile memory cells. The local word line decoder (xdec_sub) 109 includes a pull-up transistor and a pull-down transistor that selectively drive the local word line connected to a memory cell (not shown). The vertical word line VWL is a signal line that connects multiple sectors in a vertical direction and supplies a first voltage to a source terminal (voltage source terminal) of the pull-up transistor. The global word line GWL is a signal line that connects multiple sectors in a lateral direction and supplies a second voltage, which is higher than the first voltage, to a gate terminal of the pull-up transistor.

The first high voltage generating circuit 102 is provided for generating the first voltage to be applied to the source terminal of the pull-up transistor. The first high voltage generating circuit 102 includes a first booster 21 and a first pump 52. The first booster 21 internally includes a capacitor, and boosts the capacitor to generate the high voltage RVPXV (for example, 4.5 V) to be used during reading. The first pump 52 is composed of, for example, a charge pump having diodes, and generates the high voltage GVPXG (for example, 9 V) to be used during writing.

The switch circuit 103 selectively connects the first booster 21 and the first pump 52 to the vertical word line decoder 104 via a signal line VPXVq. The vertical word line decoder (vxdec) 104 selectively drives the vertical word line VWL and supplies the first voltage generated by the first high voltage generating circuit 102 to the source terminal of the pull-up transistor in the local word line decoder (xdec_sub) 109.

The second high voltage generating circuit 105 generates the second voltages RVPXG and GVPPI, which are higher than the first voltage, to be applied to the gate terminal of the pull-up transistor in the local word line decoder (xdec_sub) 109. In other words, the voltage level of the second high voltage generating circuit 105 is greater than that of the first high voltage generating circuit 102. The second high voltage generating circuit 105 includes a second booster 51 and a second pump 22. The second booster 51 internally includes a capacitor and boosts the capacitor during reading to generate the high voltage RVPXG (for example, 6 V) for reading. The second pump 22 is composed of, for example, a charge pump having diodes, and generates the high voltage GVPPI (for example, 10 V) to be used during writing.

The switch circuit 106 selectively connects the second booster 51 and the second pump 22 to the high voltage output circuit 107 via a signal line VPXGq. The high voltage output circuit (gvpx) 107 outputs a programming/reading voltage VPXq to the global word line decoder (xdec) 108. The global word line decoder (xdec) 108 selectively drives the global word line GWL to control the gate of the pull-up transistor included in the local word line decoder (xdec_sub) 109.

The local word line decoder (xdec_sub) 109, as will be described later in detail, is selectively connected to the vertical word line VWL, and the high voltage VPXVq to be supplied via the word line VWL or a ground voltage Vss is supplied to corresponding local word lines. Thus, in accordance with the present invention, the first high voltage generating circuit 102 and the second high voltage generating circuit 105 may be realized by using two different voltage levels in a same booster circuit.

Figure 4:
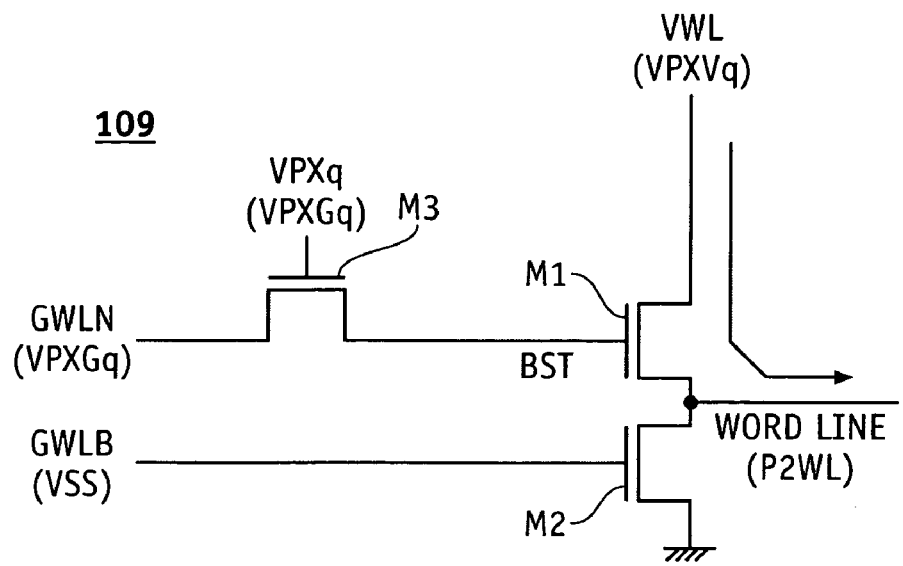
FIG. 4 is a circuit diagram of a local word line decoder of the flah memory of FIG. 3 in accordance with the embodiment of the present invention.

FIG. 4 is a circuit diagram of the local word line decoder (xdec_sub) 109. As shown in FIG. 4, the local word line decoder (xdec_sub) 109 is composed of n-channel transistors M1, M2, and M3. The transistor M1 is a pull-up transistor and the transistor M2 is a pull-down transistor. The vertical word line VWL is connected to the source terminal of the transistor M1, and is selectively connected to the local word line P2WL (n). The gate of the transistor M1 is controlled by the global word line GWLN via the transistor M3. The gate of the transistor M3 is connected by the high voltage supply line VPXGq extending from the second high voltage generating circuit 105. The gate of the transistor M2 is controlled by a global word line GWLB.

Figure 5:
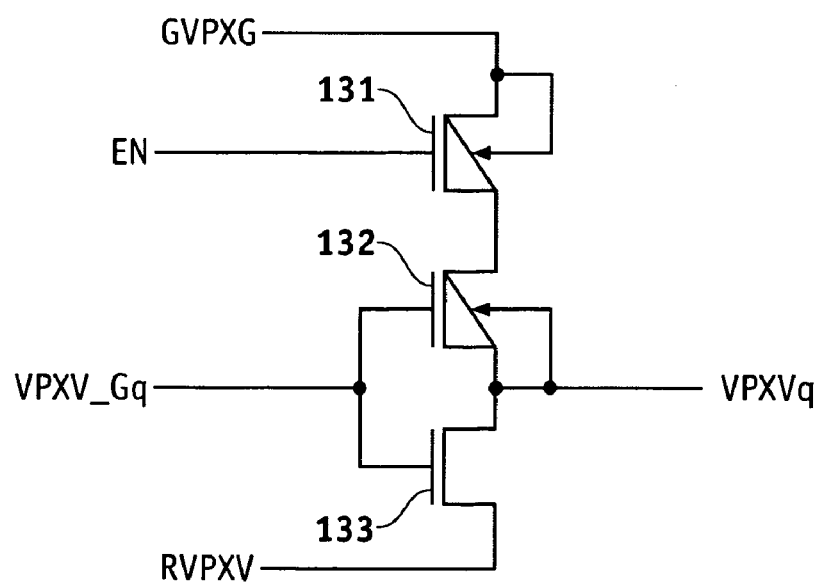
FIG. 5 is a circuit diagram of a switch circuit of the flah memory of FIG. 3 in accordance with the embodiment of the present invention.

FIG. 5 is a circuit diagram of the switch circuit 103. The switch circuit 103 includes p-channel transistors 131 and 132 and an n-channel transistor 133. The source terminal of the transistor 131 is connected to GVPXG, and the gate terminal is controlled by an enable signal EN. The source terminal of the transistor 133 is connected to RVPXV, and the drain terminal thereof and the drain terminal of the transistor 132 are connected to VPXVq. The gates of the transistors 132 and 133 are controlled by VPXV_Gq. The switch circuit 103 selectively changes between the voltage GVPXG during writing and the voltage RVPXV during reading, on the basis of EN and VPXV_Gq, which become given voltage values in accordance with the operation mode. In addition, the switch circuit 106 may have the same configuration as the switch circuit 103.

Figure 1:
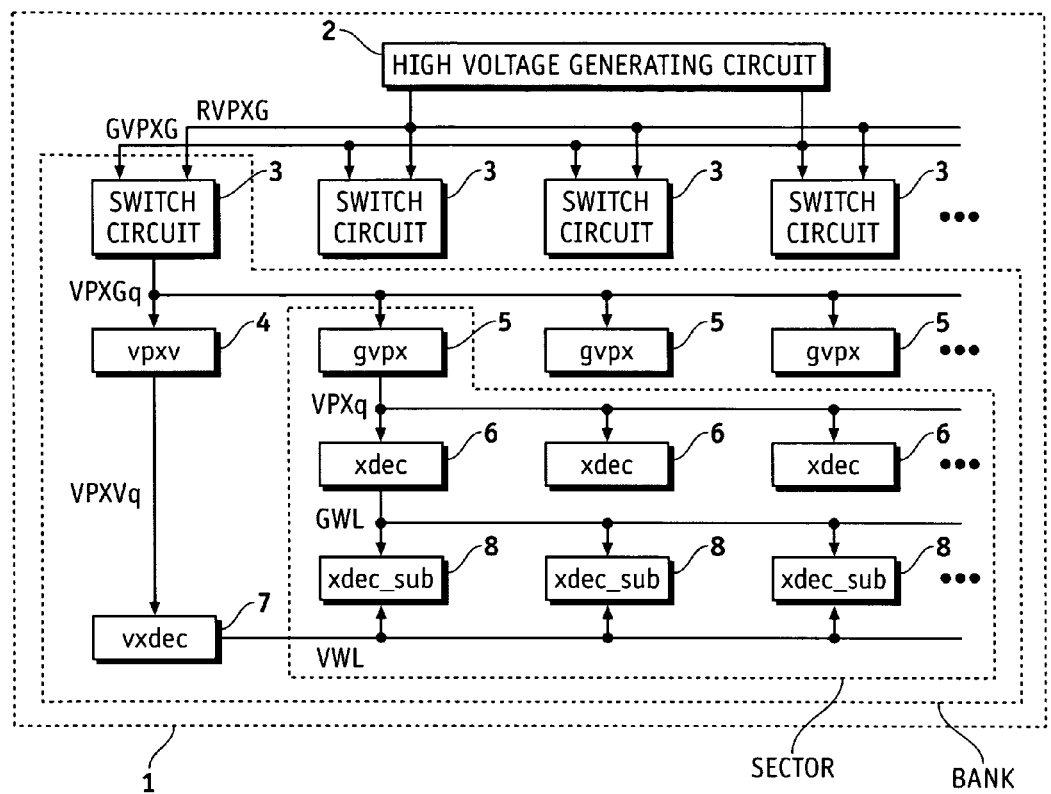
FIG. 1 is a view showing main circuit components to be used when a high voltage is applied to a local word line decoder in a conventional flash memory.
Figure 2:
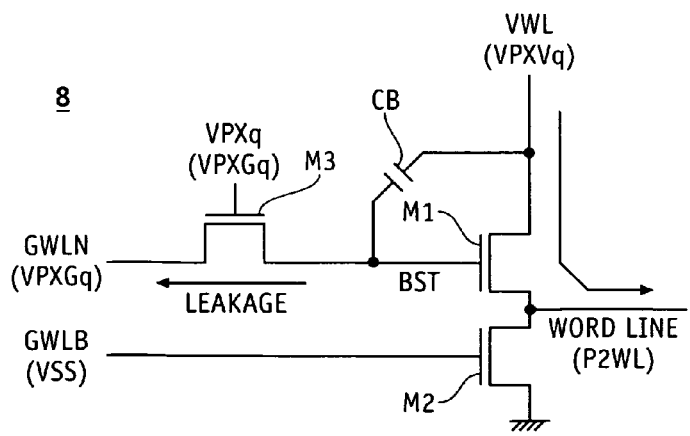
FIG. 2 is a circuit diagram showing a conventional local word line decoder.
Figure 6:
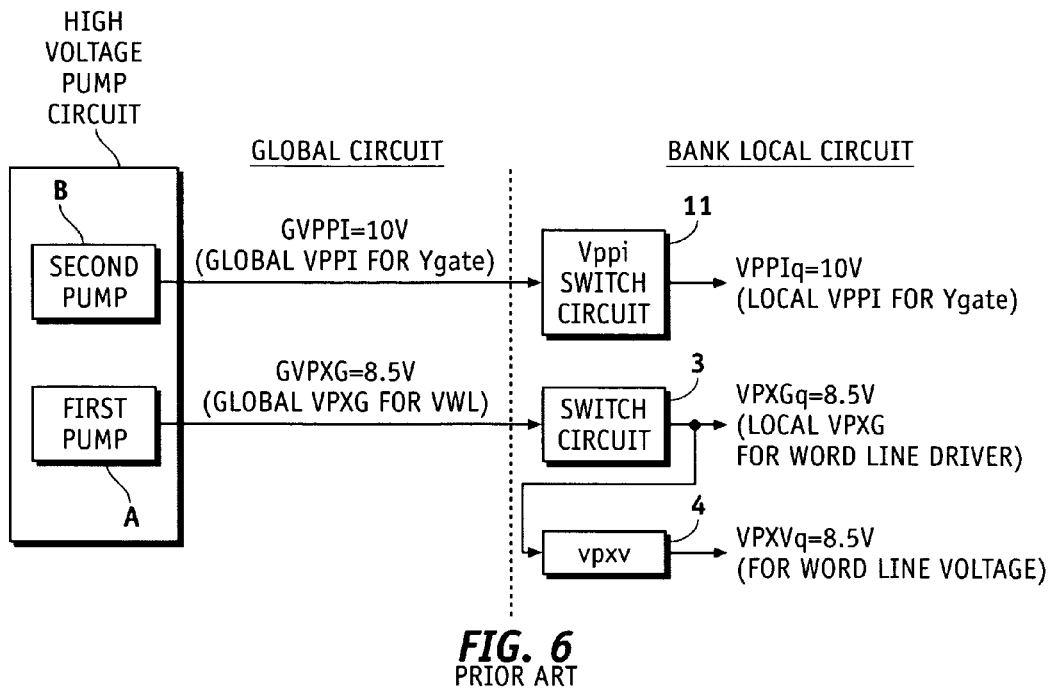
FIG. 6 is a view illustrating a high voltage generating circuit of a conventional flash memory.
Figure 7:
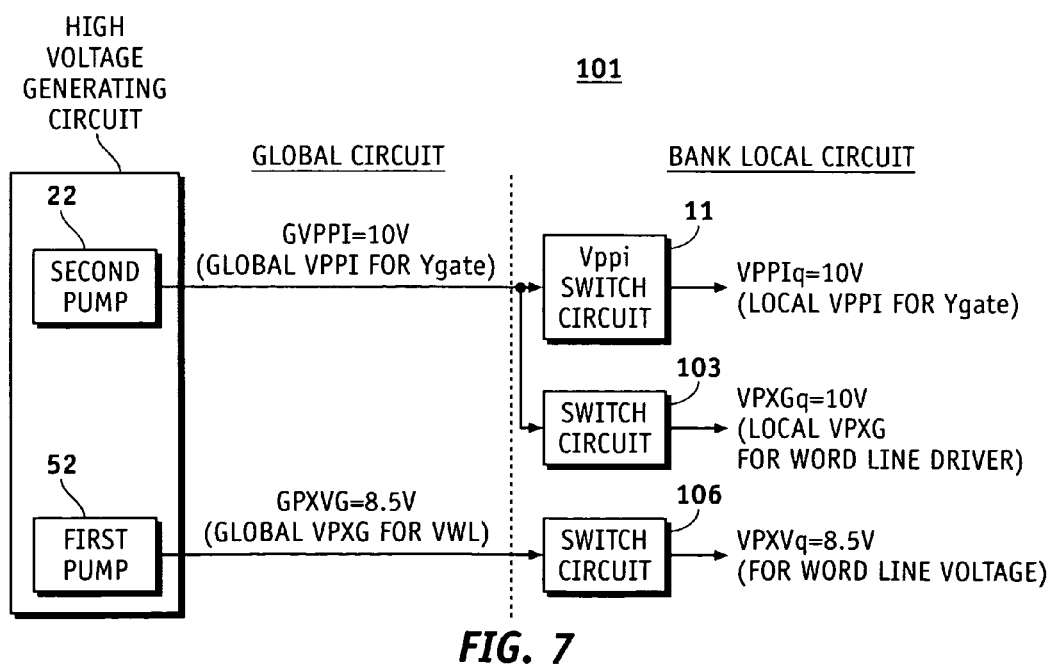
FIG. 7 is a view illustrating a high voltage generating circuit of the flash memory of FIG. 3 in accordance with an embodiment of the present invention.

FIG. 6 is a view illustrating the high voltage generating circuit of a conventional flash memory, as depicted in FIG. 1. The high voltage generating circuit in the conventional flash memory of FIG. 1 includes a first pump A and a second pump B. The first pump A corresponds to the high voltage generating circuit 2 shown in FIG. 1. Also, the switch circuit 3 and the high voltage output circuit (vpxv) 4 have the same configuration as those shown in FIG. 1. The first pump A generates the voltage GVPXG for the vertical word line and drives the gates of the transistor M1 and the transistor M3 (FIG. 2) in the local word line decoder (xdec_sub) 8. Also, the second pump B generates the gate voltage VPPI to drive the gate (Y pass gate) of a select transistor provided on the drain side of the memory cell, driving the Y pass gate via a vppi switch 11. The voltage values shown in the drawing are examples during the time of writing.

in accordance with the present invention, the following configuration is provided to supply two different voltage sources to the vertical word line VWL and the global word line GWL, so that the local word line decoder (xdec_sub) can be downsized. FIG. 7 is a view illustrating the high voltage generating circuit included in a flash memory in accordance with an embodiment of the present invention, as depicted in FIG. 3. The flash memory 101 includes a global circuit and a bank local circuit, as shown in FIG. 7. The high voltage generating circuit, also shown in FIG. 3, includes the second pump 22 and the first pump 52. The second pump 22 boosts the power supply voltage VCC to generate the voltage GVPPI (for example, 10 V), supplying a gate voltage VPPIq to the Y pass gate provided on the drain side of the memory cell via the vppi switch circuit 11 and further supplying the word line driving voltage VPXGq (for example, 10 V) to the gate of the transistor M1 and that of the transistor M3 included in the local word line decoder 109 via the switch circuit 103.

The first pump 52 boosts the power supply voltage VCC to generate a voltage GVPXVq (for example, 8.5 V) and supplies the word line voltage VPXVq to the source terminal of the transistor M1 included in the local word line decoder (xdec_sub) 109 via the switch circuit 106. In this manner, with the circuit that generates the high voltage for driving the Y pass gate, it is possible to generate the voltage that drives the Y pass gate and the voltage to be applied to the gate terminal of the pull-up transistor M1 included in the local word line decoder 109, enabling the high voltage generating circuit to be commonly used and, thereby, enabling the circuit to be downsized. Accordingly, a description has been given of an example of using the pump circuit that generate the driving voltage of the Y pass gate, which has conventionally been provided in the first pump 52; yet, another pump may be provided. The voltage values shown in the drawing are examples.

Figure 8:
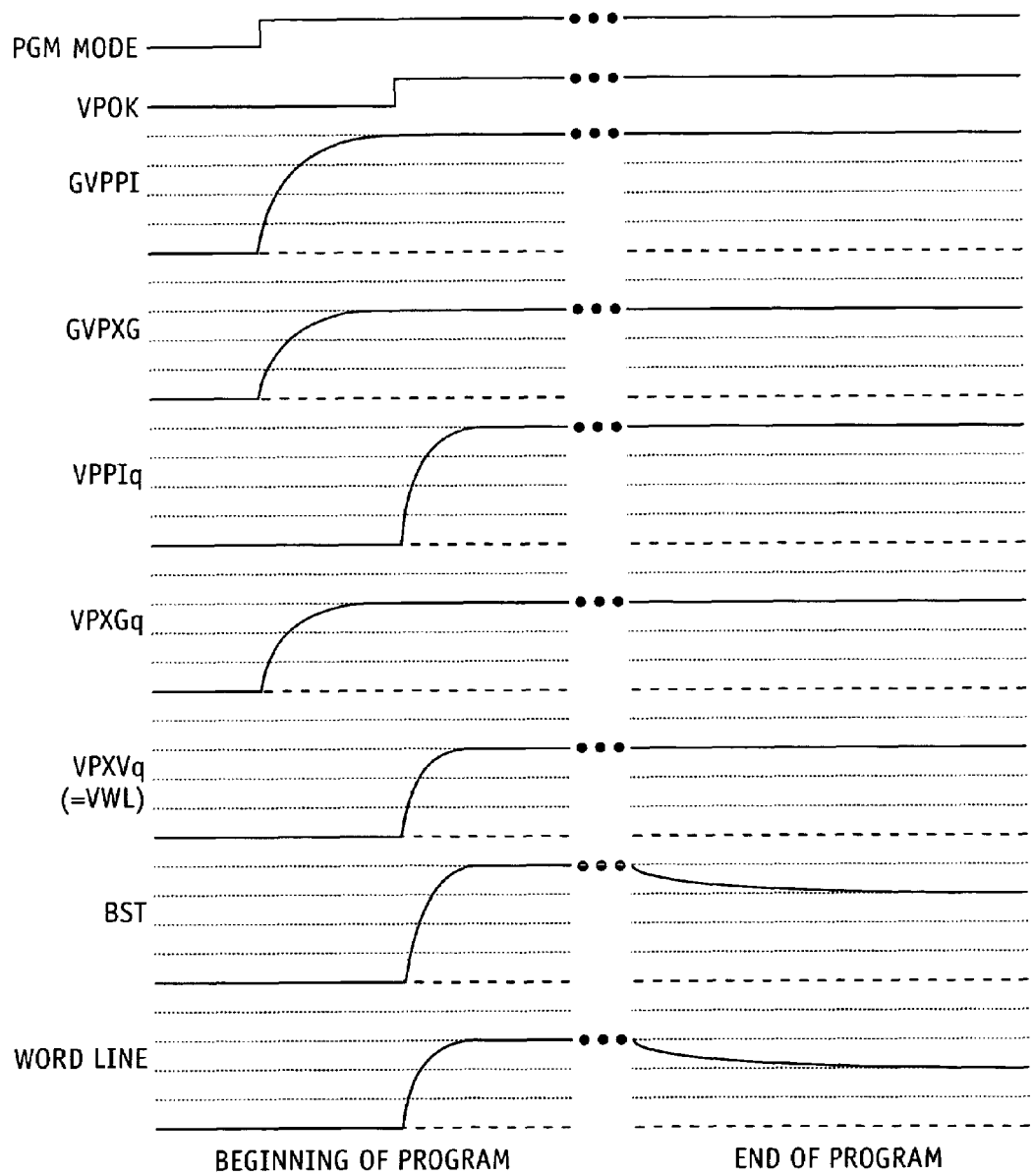
FIG. 8 is a timing chart during programming in accordance with a conventional flash memory programming technique.
Figure 9:
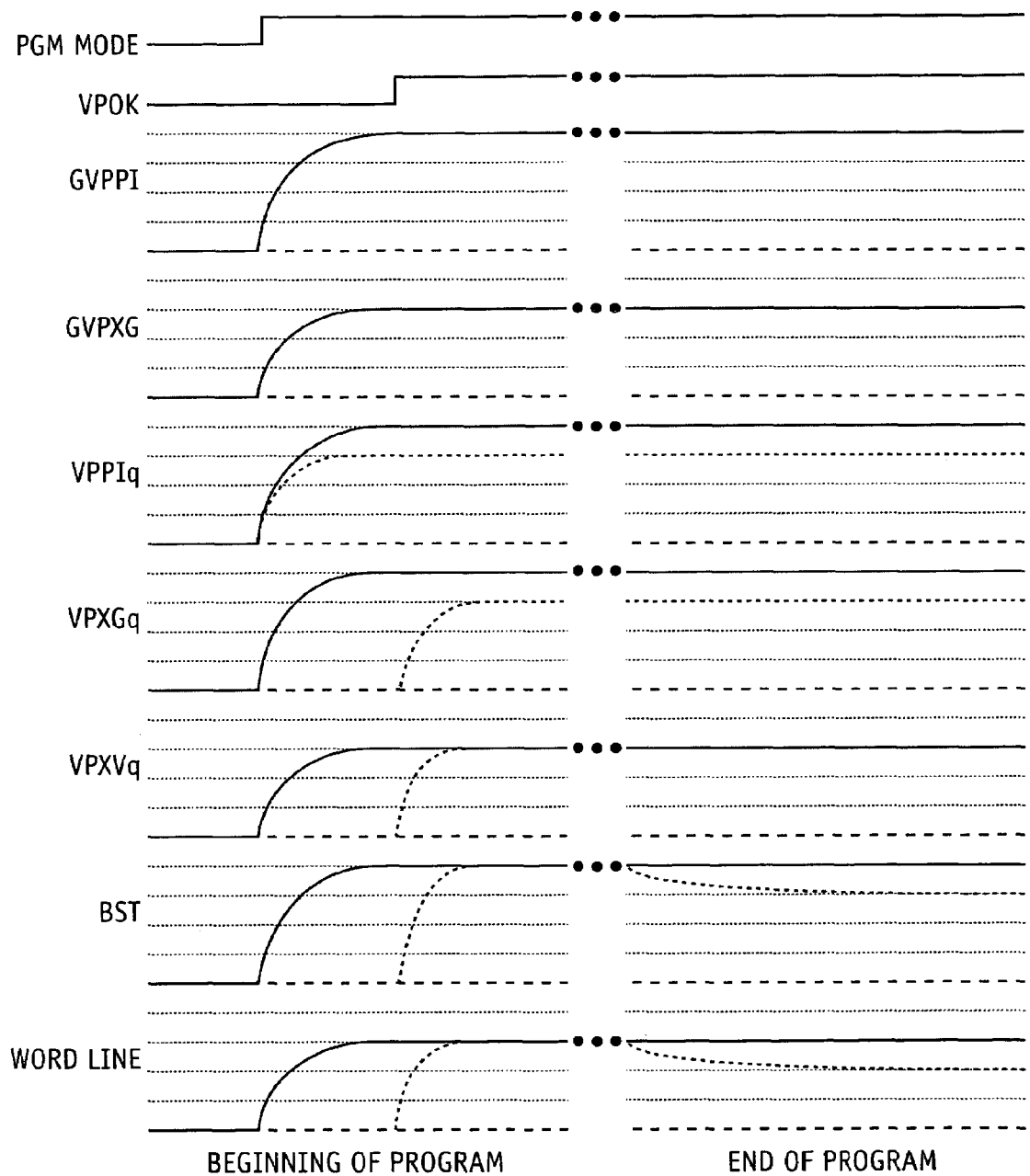
FIG. 9 is a timing chart during programming after two voltage sources are provided in accordance with the embodiment of the present invention.

FIG. 8 is a timing chart during programming in a flash memory in accordance with a conventional programming technique. FIG. 9 is a timing chart during programming after two voltage sources are provided in the flash memory in accordance with the present invention. During the programming operation, a high voltage such as 8.5 V is applied to the word line. For this reason, as shown in FIGS. 1, 2, 6, and 8, in the conventional flash memory 1, the word line driving voltage VPXGq must first be boosted to prevent a drop from the threshold voltage of the pull-up transistor M1 included in the local word line decoder (xdec_sub) 8. Then, after it is confirmed that the voltage is sufficiently boosted, the voltage is supplied to the vertical word line VWL through the VPXVq to operate the bootstrap. The word line is driven by only a single voltage source generated in the first pump A.

Referring now to FIGS. 7 and 9, however, in the flash memory 101 in accordance with the present invention, the first pump 52 generates the word line voltage VPXVq and the second pump 22 generates the word line driving voltage VPXGq, which is higher than the word line voltage VXPVq. The voltages are applied to the local word line decoder (xdec_sub) 109 from the two voltage sources. This makes it possible to obtain the voltage to drive the transistor M1 without adjusting an input timing between the word line voltage VPXVq and the word line driving voltage VPXGq, as shown in FIG. 9, enabling the number of circuit elements to be reduced. In this manner, the second high voltage generating circuit 105 is capable of generating the second voltage at a same timing as that the first high voltage generating circuit 102 generates the first voltage. This eliminates the necessity of waiting for the word line driving voltage VPXGq to be boosted, reducing the whole operation period including the period for boosting the word line.

In addition, even if the flash memory is further downsized and the load capacitance CB of the node BST becomes small, it is possible to appropriately supply the word line voltage, because a voltage sufficiently higher than that applied to the vertical word line VWL is applied to the global word line GWL. Furthermore, the leakage from the transistor M3 does not lower the voltage of the node BST and, accordingly, it is possible to drive the word line for a long period.

Figure 10:
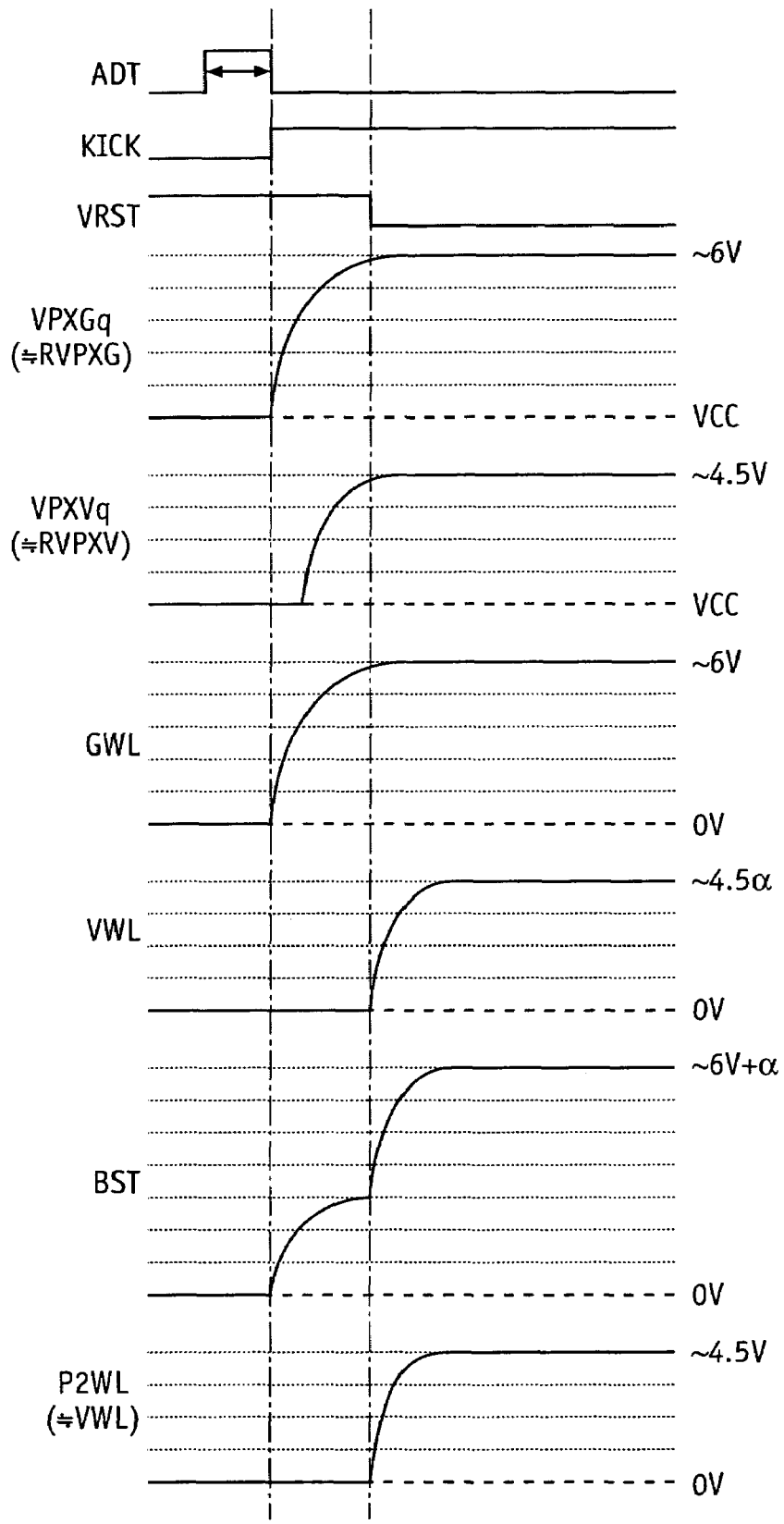
FIG. 10 is a timing chart during reading after two voltage sources are provided in accordance with the embodiment of the present invention.

FIG. 10 is a timing chart during reading with two voltage sources provided in the flash memory in accordance with the present invention. With an address change detection signal ATD, the first booster 21 and the second booster 51 are reset and the decode setting is implemented. When the address change detection signal ATD becomes Low, a boost signal KICK, which is a signal showing a boost start, becomes High and the first booster 21 and the second booster 51 start boosting. The high voltage VPXGq is boosted to 6 V, for example, by the second booster 51, and is applied to the gate terminal of the pull-up transistor M1 to supply power to the node BST. The high voltage VPXVq is boosted to 4.5 V, for example, by the first booster 21 and is applied to the source terminal of the pull-up transistor M1 when a signal VRST, connecting the high voltage supply line VPXVq and the vertical word line VWL, becomes Low. The node BST becomes a higher level by being coupled with the vertical word line VWL, making the vertical word line VWL equal to the level of the local word line P2WL.

Figure 11:
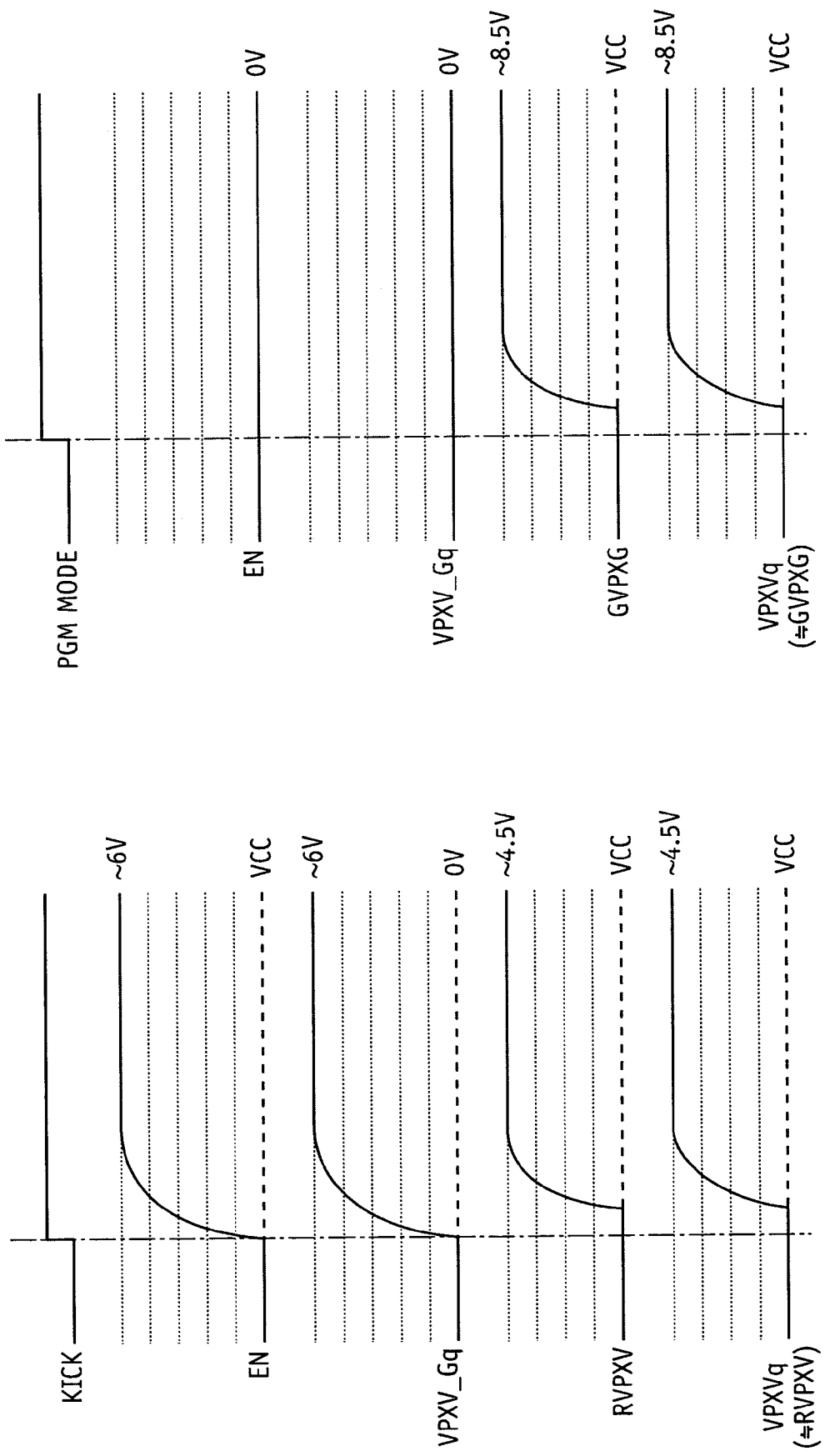
FIG. 11A and FIG. 11B are timing charts of a switch circuit in accordance with the embodiment of the present invention.

FIGS. 11A and 11B are timing charts showing the operation of the switch circuit 103 in accordance with the present invention. FIG. 11A shows a switching operation in a selected bank during reading. FIG. 11B shows the switching operation in the selected bank during writing. Referring to FIG. 11A, when the boost signal KICK showing the boost start becomes High during reading, by voltage supplied from the second booster 51, the high voltage supply line VPXV_Gq and the enable signal EN have a high voltage (for example, 6 V), and by voltage supplied from the first booster 21, a high voltage supply line RVPXV has a high voltage (for example, 4.5 V). Transistors 131 and 132 are turned off and the transistor 133 is turned on, making the voltage RVPXV equal to VPXVq (here, VPXV_Gq>RVPXV).

As shown in FIG. 11B, during writing, when a signal of PGM_mode becomes High, the second pump 22 generates the high voltage VPXGq (for example, 10 V), and the first pump 52 generates the high voltage GVPXG (for example, 8 V). The enable signal EN and VPXV_Gq become VSS, the transistors 131 and 132 are turned on, and the transistor 133 is turned off, thereby applying high voltage to the high voltage supply line VPXVq.

Figure 12:
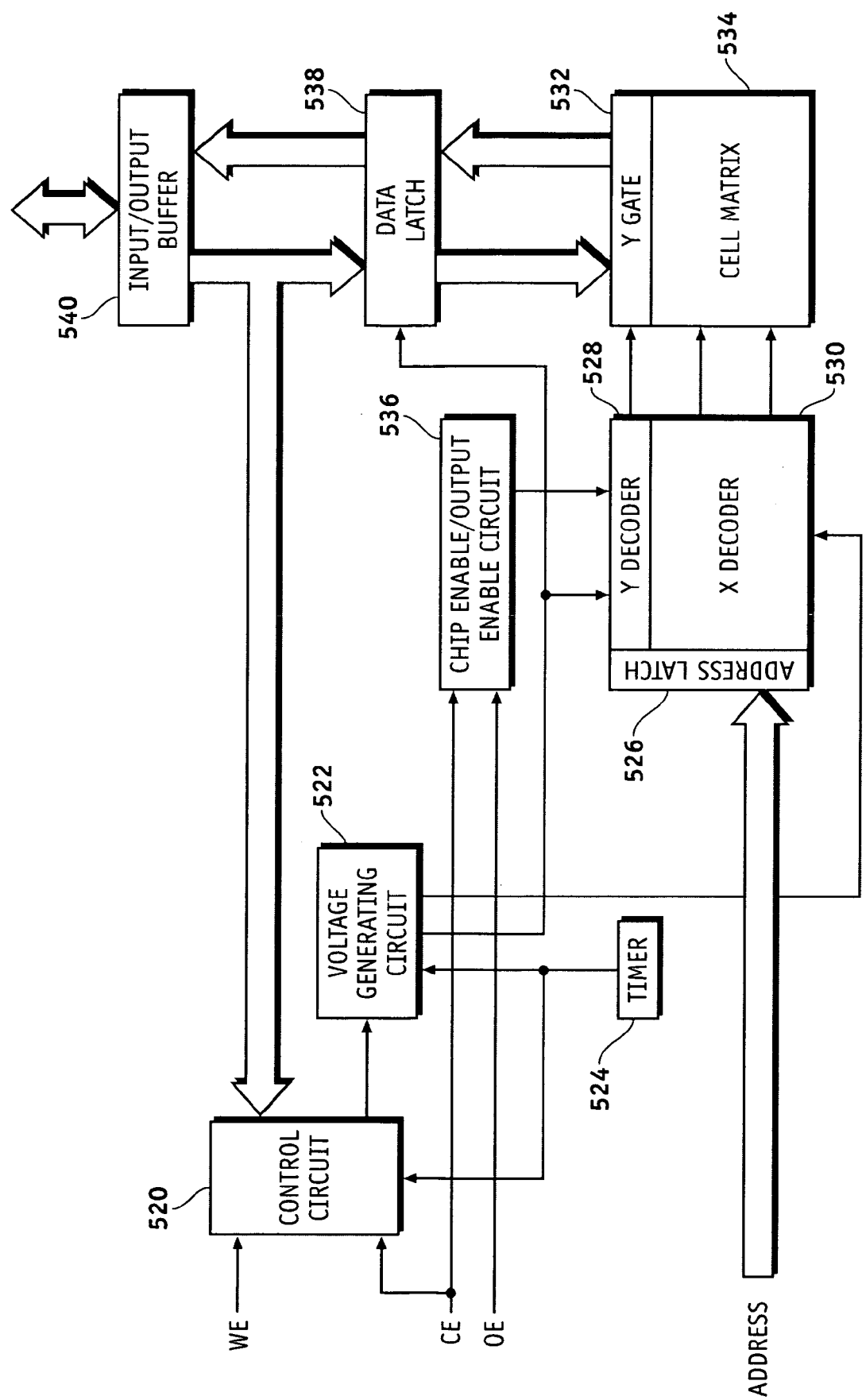
FIG. 12 is a block diagram showing a configuration of the flash memory, which is a semiconductor device in accordance with an embodiment of the present invention.

FIG. 12 is a block diagram showing the configuration of the flash memory, a semiconductor device in accordance with an embodiment of the present invention. The flash memory includes a control circuit 520, a voltage generating circuit 522, a timer 524, an address latch 526, a Y decoder 528, an X decoder 530, a Y gate 532, a cell matrix 534, a chip enable/output enable circuit 536, a data latch 538, and an input/output buffer 540. The control circuit 520 internally includes a command register, operates in synchronization with a chip enable signal CE or a write enable signal WE externally supplied, and generates and outputs a timing signal in accordance with the command externally supplied via the input/output buffer 540. The high voltage generating circuit 522 corresponds to the first high voltage generating circuit 102 and the second high voltage generating circuit 105 in FIG. 3.

The timer 524 generates clock and timing signals to be used internally. The address latch 526 latches the address received externally and supplies the address to the Y decoder 528 and the X decoder 530. The X decoder 530 corresponds to the vertical word line decoder (vxdec) 104, the global word line decoder (xdec) 108, and the local word line decoder (vdec_sub) 109. The chip enable/output enable circuit 536 receives the chip enable signal CE to activate the Y decoder 528 and receives the output enable signal OE to activate the input/output buffer 540.

Data read out of the cell matrix 534 is externally output via the Y gate 532, the data latch 538, and the input/output buffer 540. The data received externally is written into a selected memory cell in the cell matrix 534 via the input/output buffer 540, the data latch 538, and the Y gate 532.

In accordance with the flash memory 101, two voltage sources are used for driving the word line driver. This makes it possible to apply a sufficient voltage as a gate voltage of the transistor M1 even if the flash memory is further downsized. In addition, during driving the word line, the transistor M3 that clamps the node BST is prevented from leaking, thereby preventing the node BST from discharging or leading to a voltage drop. Thus, a sufficient voltage is thereby available for the gate voltage of the transistor M1. In addition, even if the flash memory is further downsized, the transistor M3 is prevented from leaking, therby preventing leakage problems in driving the word line even for a short period.

The semiconductor device may be individually packaged, such as a flash memory, or may be incorporated into a semiconductor device as one part thereof, such as a system LSI.

Although a few preferred embodiments of the present invention have been shown and described, it is appreciated by those skilled in the art that changes may be made in these embodiments without departing from the principles and spirit of the invention, the scope of which is defined in the claims and their equivalents.

What is claimed is:

1. A nonvolatile semiconductor memory device comprising:
    a plurality of non-volatile memory cells divided into sectors;
    a first decoder including a pull-up transistor for selecting and driving a word line connected to the plurality of non-volatile memory cells;
    a first voltage generating circuit generating a first voltage applied to a source terminal of the pull-up transistor;
    a vertical word line connecting the sectors in a vertical direction and carrying the first voltage from the first voltage generating circuit to the source terminal of the pull-up transistor;
    a second voltage generating circuit generating a second voltage that is applied to a gate terminal of the pull-up transistor and is higher than the first voltage;
    a global word line connecting the sectors in a lateral direction and carrying the second voltage from the second voltage generating circuit to the gate terminal of the pull-up transistor;
    a second decoder selecting and driving the global word line; and
    a third decoder selecting and driving the vertical word line.

2. The nonvolatile semiconductor memory device as claimed in claim 1, further comprising a switch circuit selectively connecting the first voltage generating circuit to the third decoder.

3. The nonvolatile semiconductor memory device as claimed in claim 1, further comprising a switch circuit selectively connecting the second voltage generating circuit to the second decoder.

4. The nonvolatile semiconductor memory device as claimed in claim 1, wherein the first voltage generating circuit comprises a first reading boost circuit generating a first reading voltage used during reading and a first writing boost circuit generating a first writing voltage used during writing.

5. The nonvolatile semiconductor memory device as claimed in claim 1, wherein the second voltage generating circuit generates a gate voltage applied to a select transistor provided on a drain side of the memory cells.

6. The nonvolatile semiconductor memory device as claimed in claim 1, wherein the second voltage generating circuit generates the second voltage at a same time as the first voltage generating circuit generates the first voltage.

7. A method for controlling a nonvolatile semiconductor memory device comprising the steps of:
    generating, by a first voltage generating circuit, a first voltage applied to a source terminal of a pull-up transistor selecting and driving a word line connected to nonvolatile memory cells, wherein the first voltage generating circuit generates a first reading voltage for use during reading and generates a first writing voltage for use during writing; and
    generating, by a second voltage generating circuit, a second voltage that is applied to a gate terminal of the pull-up transistor and is higher than the first voltage.

8. The method as claimed in claim 7, wherein the step of generating the second voltage comprises the step of generating a second reading voltage for use during reading and generating a second writing voltage for use during writing.

9. The method as claimed in claim 7, wherein the step of generating the second voltage generates the second voltage at a same time as the first voltage is generated.

10. The nonvolatile semiconductor memory device as claimed in claim 1, wherein the second voltage generating circuit comprises a reading boost circuit generating a reading voltage used during reading and a writing boost circuit generating a writing voltage used during writing.

11. The nonvolatile semiconductor memory device as claimed in claim 4, wherein the second voltage generating circuit comprises a second reading boost circuit generating a second reading voltage used during reading and a second writing boost circuit generating a second writing voltage used during writing.

12. A method for controlling a nonvolatile semiconductor memory device comprising the steps of:

generating, by a first voltage generating circuit, a first voltage applied to a source terminal of a pull-up transistor selecting and driving a word line connected to nonvolatile memory cells; and generating, by a second voltage generating circuit, a second voltage that is applied to a gate terminal of the pull-up transistor and is higher than the first voltage, wherein the second voltage generating circuit generates a reading voltage for use during reading and generates a writing voltage for use during writing.

* * * * *